United States Patent
Funyu et al.

(10) Patent No.: US 7,466,763 B2
(45) Date of Patent: Dec. 16, 2008

(54) ADDRESS GENERATING DEVICE AND METHOD OF GENERATING ADDRESS

(75) Inventors: Yasuhito Funyu, Kawasaki (JP); Takeshi Ohba, Kawasaki (JP); Hideharu Shako, Kawasaki (JP)

(73) Assignee: Fujitsu Limited, Nakahara-Ku, Kawasaki-Shi Kanagawa (JP)

( * ) Notice: Subject to any disclaimer, the term of this patent is extended or adjusted under 35 U.S.C. 154(b) by 456 days.

(21) Appl. No.: 11/268,652

(22) Filed: Nov. 8, 2005

(65) Prior Publication Data

US 2007/0030920 A1 Feb. 8, 2007

(30) Foreign Application Priority Data

Aug. 8, 2005 (JP) ............................. 2005-229059

(51) Int. Cl.
*H04L 25/49* (2006.01)

(52) U.S. Cl. .................................................. 375/296

(58) Field of Classification Search ......... 375/295–297, 375/285; 332/106, 107, 117, 123, 149, 159
See application file for complete search history.

(56) References Cited

U.S. PATENT DOCUMENTS 7,333,559 B2 * 2/2008 Song et al. .................. 375/296
2002/0002573 A1 * 1/2002 Landers et al. .............. 708/501

FOREIGN PATENT DOCUMENTS

JP 2003-347944 12/2003

* cited by examiner

*Primary Examiner*—Tesfaldet Bocure
(74) *Attorney, Agent, or Firm*—Fujitsu Patent Center

(57) ABSTRACT

An address frequency operation unit counts frequencies of occurrences of addresses output by an address conversion unit 14, and a CPU 16 rewrites an address conversion table in the address conversion unit 14 based on a comparison between the counted result and a threshold value. When the frequency of the address is lower than the threshold value, the frequency of occurrence of an output address is increased by increasing the number of input addresses corresponding to one output address. Also, distortion in an output signal which is fed back is detected and the address conversion table is rewritten so that the distortion is decreased.

11 Claims, 9 Drawing Sheets

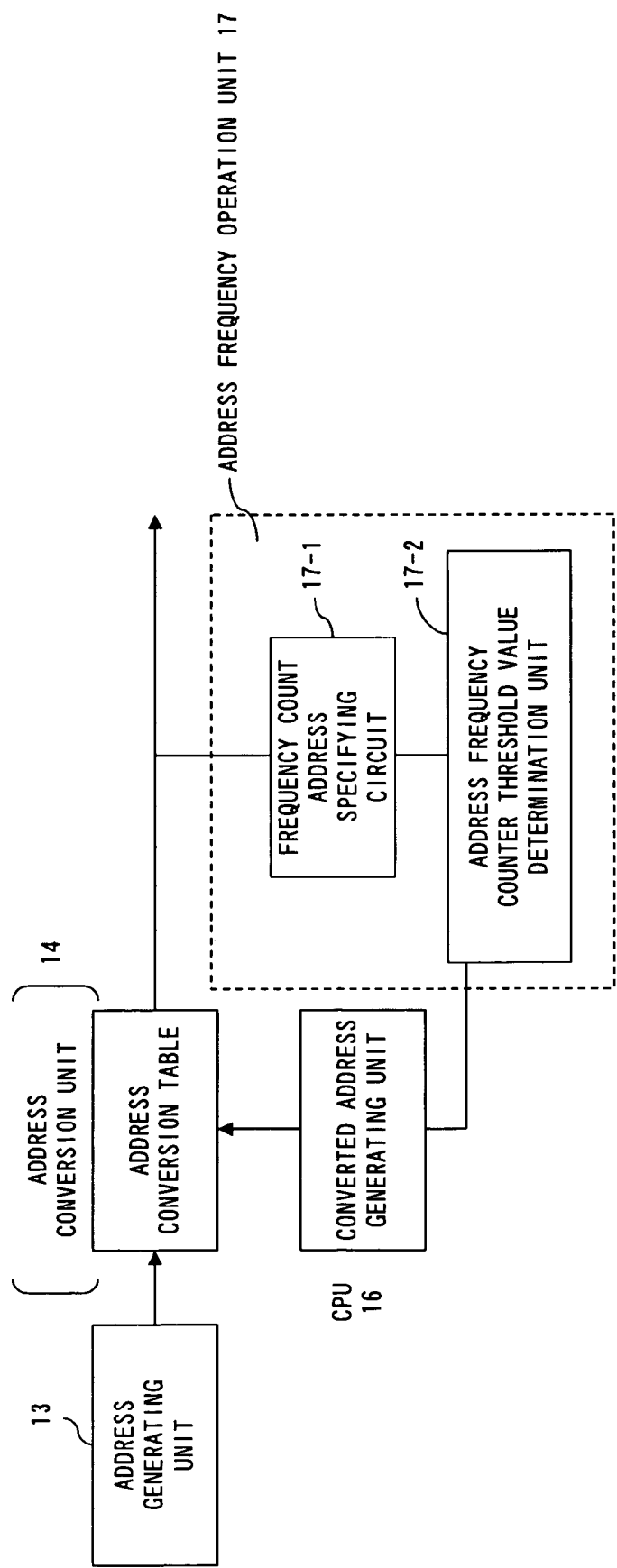
F I G. 7

ADDRESS GENERATING DEVICE AND METHOD OF GENERATING ADDRESS

BACKGROUND OF THE INVENTION

1. Field of the Invention

The present invention relates to an address generating device for indexing a table in a distortion compensator of a wireless communication device, and to a method of generating the address.

2. Description of the Related Art

FIG. 1 to FIG. 4 explain problems in conventional techniques.

In a conventional distortion compensator, index addresses for a look up table (LUT) are generated in accordance with electric power supplied, and when the address is generated as the log of electric power supplied, the occurrence rate of the addresses generated in accordance with the electric power supplied presents distribution indicated as "through" in FIG. 1. This "through" appears in the case where LUT index addresses are linearly assigned with respect to the electric power supplied. Then, the occurrence distribution of addresses involves bias, specifically, in a range where the electric power is large the occurrence rate of addresses is low, which results in poor convergence in a distortion compensation table. Specifically, distortion compensation coefficients corresponding to addresses with a low occurrence rate are updated at a low frequency so that a value of the distortion compensation coefficient converges to a suitable value slowly. FIG. 2 shows an example of a value of a distortion compensation coefficient when index addresses with respect to electric power supplied are generated by a "through" method. In FIG. 2, the vertical axis represents the value of a distortion compensation coefficient after a prescribed time period, and the horizontal axis represents the value of an index address. As is obvious from this figure, some values of the distortion compensation coefficients are abnormal.

In view of the above problem, in the Patent Document 1, a method is disclosed in which the frequency of the occurrence of addresses is counted, and conversions of addresses are conducted such that the distribution of frequencies of occurrences of respective addresses is constant. However, when the distribution of addresses is constant, it sometimes happens that the number of addresses which can be assigned to the distortion compensation coefficient in a range with a large electric power is reduced so that distortion compensation characteristic deteriorates.

Patent Document 1

Japanese Patent Application Publication No. 2003-347944

FIG. 3 shows the relationship between input addresses (in proportion to electric power supplied) and output addresses (index addresses) in an address conversion unit for the case of the "through" method and the case of constant assignment. The line for the case of constant assignment represents an image of address conversion for the case where the occurrence frequency of index addresses is constant, and when the address frequency is constant, almost half of the input addresses are assigned to one address. In FIG. 3, output addresses are assigned to one value "19" when input addresses are greater than or equal to "11". Accordingly, in the case of constant assignment, half of the input addresses which have a large electric power are compensated with one distortion compensation coefficient.

However, in a characteristic of an amplifier as shown in FIG. 4, the output power with respect to the electric power supplied to the amplifier distorts in a range where the electric power supplied is large. Thus, it is desired that the distortion compensation characteristic is precise in a range where the electric power supplied is large. However, in the case of constant assignment, in a range where the electric power supplied is large, distortion compensation is conducted with the smaller number of distortion compensation coefficients, accordingly, precise distortion compensation characteristics cannot be obtained.

SUMMARY OF THE INVENTION

It is an object of the present invention to provide an LUT address generating device by which distortion compensation characteristics are improved and distortion compensation coefficients converge quickly.

An index address generating device for an index address of a look up table according to the present invention is an address generating device of a distortion compensation device, in which an electric power value of an input signal is converted into an address, a table is indexed by using an index address for a table constructed by converting the address, and the index address generating device comprises an operation unit for counting the occurrence frequency of the index address for table input to the table and comparing it with a threshold value, and an address changing unit for changing the number of addresses corresponding to the index addresses for the table in accordance with the comparison result between the occurrence frequency and the threshold value.

According to the present invention, an address generating device by which distortion compensation coefficients converge quickly and that can constitute a distortion compensation device with excellent distortion compensation characteristics, and a method of generating an address in the above way can be provided.

BRIEF DESCRIPTION OF THE DRAWINGS

FIG. 7 is a block diagram of a control device for the address conversion table;

DESCRIPTION OF THE PREFERRED EMBODIMENT

In an embodiment of the present invention, in an LUT in which an address proportional to the electric power supplied is an input address, the occurrence rate of an address is optimized so that convergence and distortion compensation performance of the LUT are improved by using an address conversion table.

In order to realize the above, the occurrence frequencies of addresses input to a distortion compensation table are counted, and an address conversion table in an address conversion unit is controlled so that all the input addresses have occurrence frequencies which are higher than a prescribed value.

Also, the address conversion table is controlled so that the distortion is minimized by detecting not only the occurrence frequency of addresses but also the characteristics of the output signal after distortion compensation by an FFT or the like, thereby, addresses are optimized more effectively.

Figure 5:
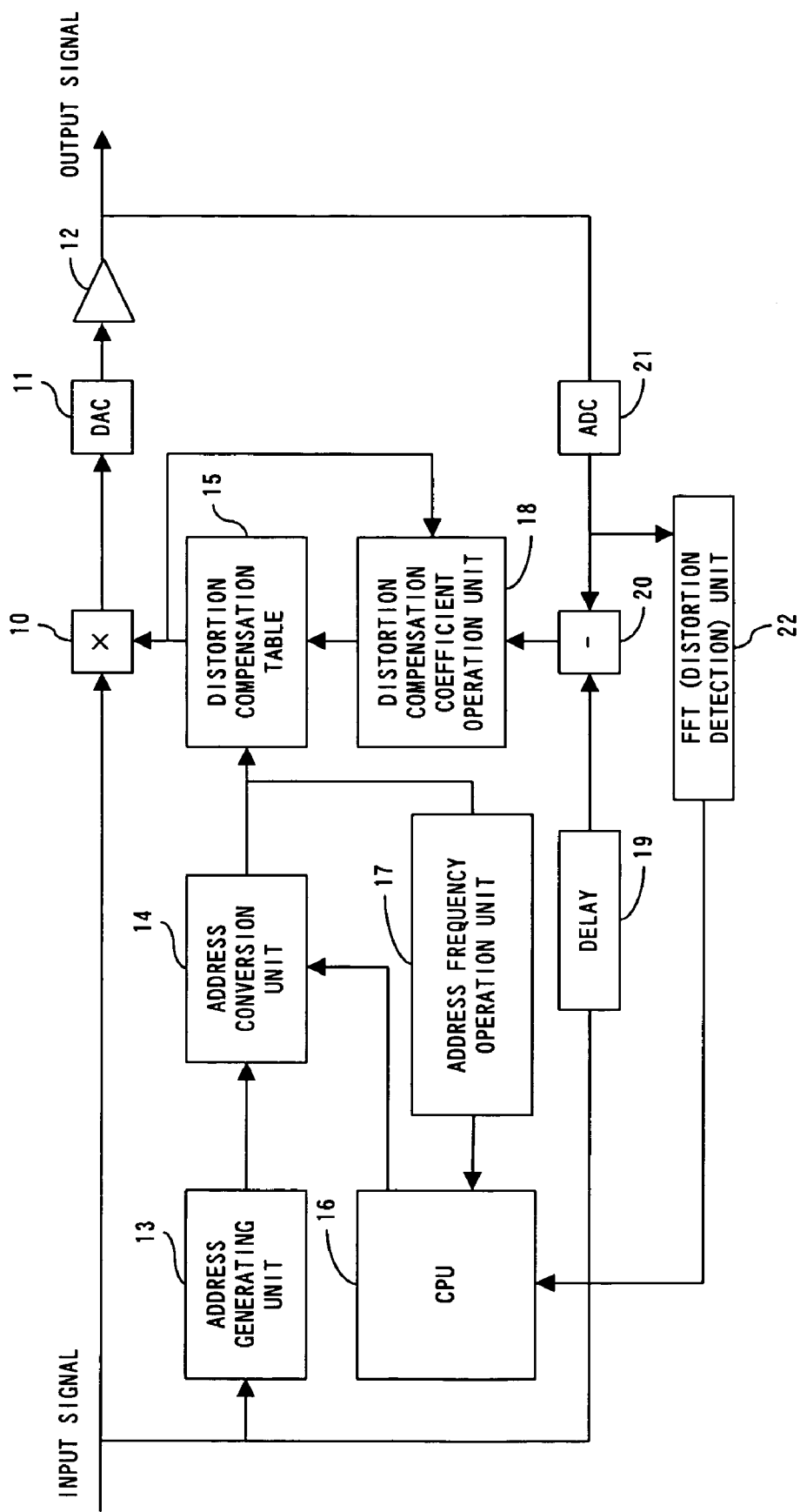
FIG. 5 shows an example of an entire configuration of a device according to an embodiment of the present invention.
Figure 6:
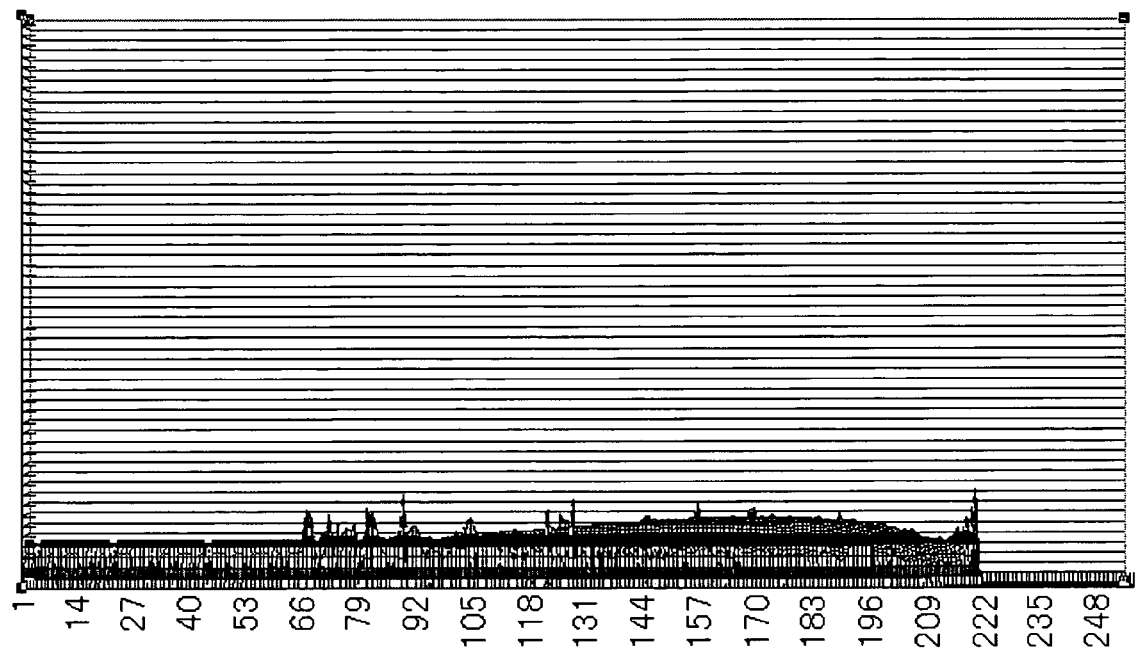
FIG. 6 shows distortion compensation coefficient values in the case where an address conversion table is optimized in accordance with an embodiment of the present invention.

FIG. 5 shows an example of an entire configuration of a device according to an embodiment of the present invention. FIG. 6 shows distortion compensation coefficient values in the case where the address conversion table is optimized in accordance with an embodiment of the present invention.

In FIG. 5, an input signal is input to a multiplier 10 and is multiplied with a distortion compensation coefficient. Output from the multiplier 10 is converted from a digital signal to an analog signal by a D/A converter 11, is amplified by an amplifier 12, and is output as an output signal. The input signal is input to a delay device 19, is delayed, and is input to a subtractor 20. Also, the output signal is input to a subtractor 20 after being converted from an analog signal to a digital signal by an A/D converter 21. An error signal which is the difference between the input signal and the output signal and which is operated on by the subtractor 20 is input to a distortion compensation coefficient operation unit 18, and is used for update of a distortion compensation table 15.

The input signal is also, input to an address generating unit 13, and is converted to an address for indexing a distortion compensation table 15. At this stage, in an embodiment of the present invention, an address conversion unit 14 is provided which comprises rewritable memory such as RAM or the like, and converts the output from the address generating unit 13, and inputs the converted output to the distortion compensation table 15. A distortion compensation coefficient is read from the distortion compensation table 15, based on the input address, and is input to the multiplier 10, and the distortion compensation coefficient is updated by the distortion compensation coefficient operation unit 18. The output from the address conversion unit 14 is also input to an address frequency operation unit 17. The address frequency operation unit 17 counts the frequency of the address output by the address conversion unit 14. The count result of the address frequency operation unit 17 is input to a CPU 16. The CPU 16 determines whether or not the counted address frequency is lower than a prescribed value, and rewrites the address conversion table in the address conversion unit 14 in accordance with whether the address frequency is higher or lower than the prescribed value.

Also, an FFT (distortion detection) unit 22 applies an FFT operation to an output signal which is fed back, and calculates the amount of distortion. This result is input to the CPU 16, and the CPU 16 rewrites the address conversion table in the address conversion unit 14 in accordance with the distortion detection result.

Figure 1:
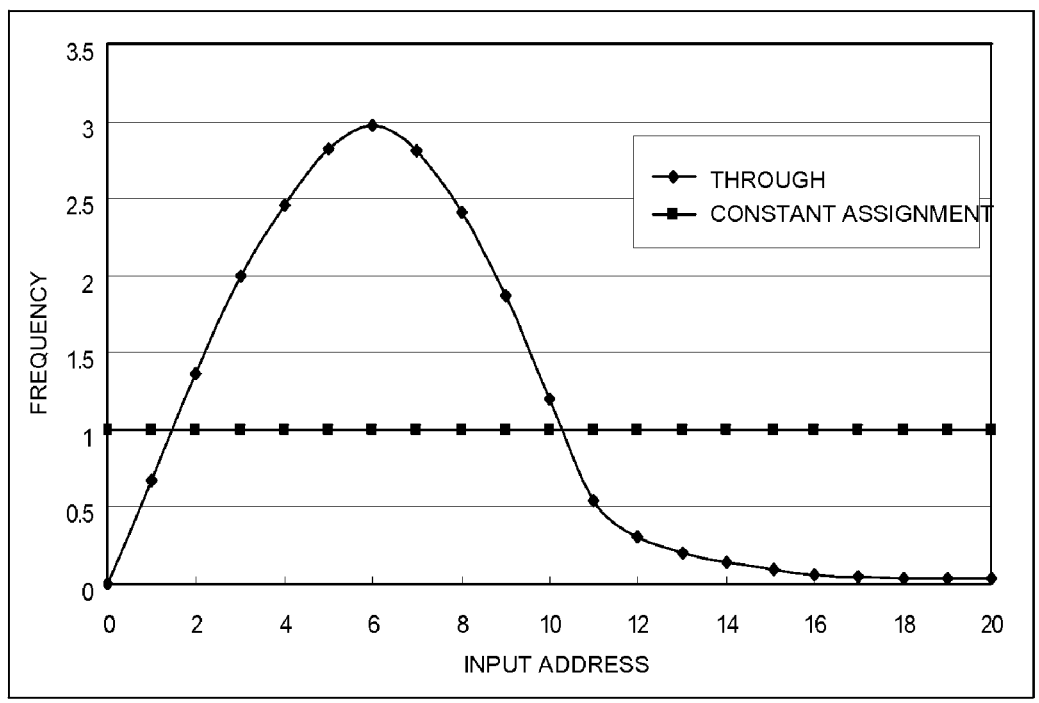
FIG. 1 explains a problem of a conventional technique (first)
Figure 2:
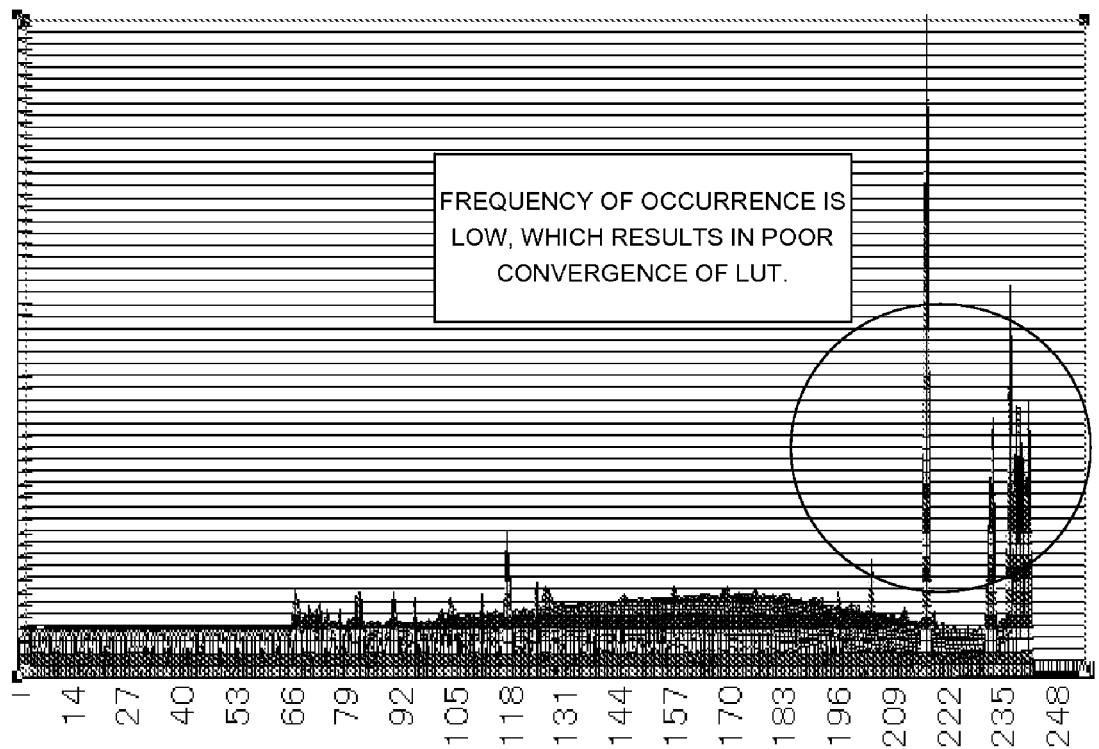
FIG. 2 explains a problem of a conventional technique (second)
Figure 3:
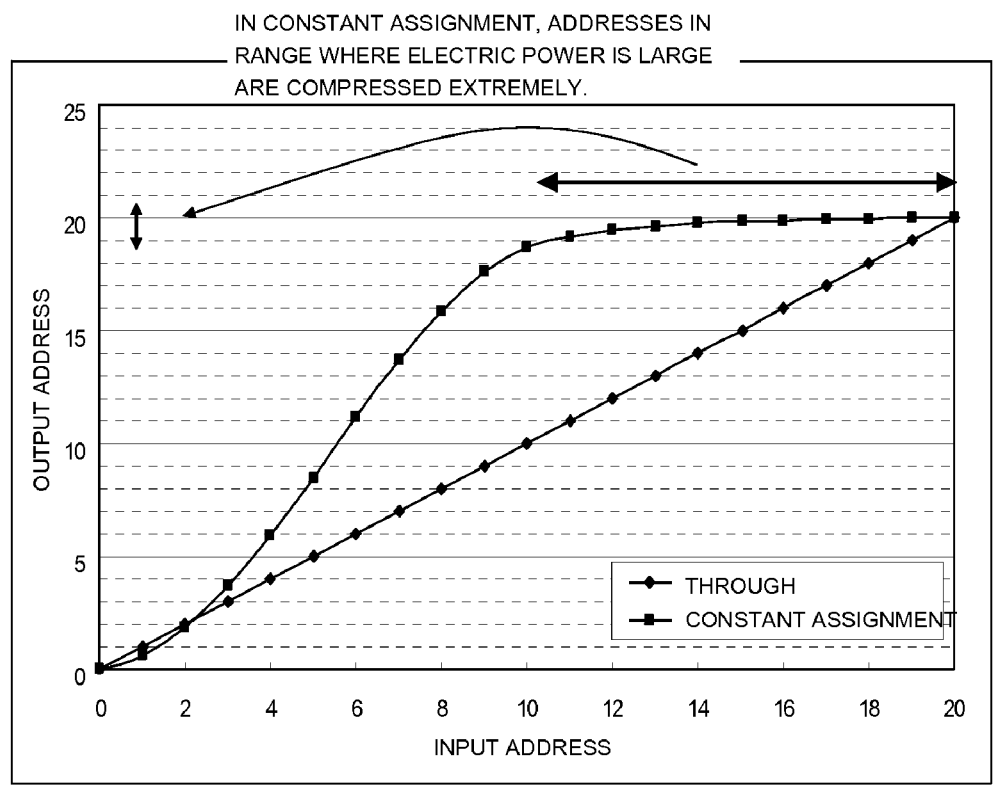
FIG. 3 explains a problem of a conventional technique (third)
Figure 4:
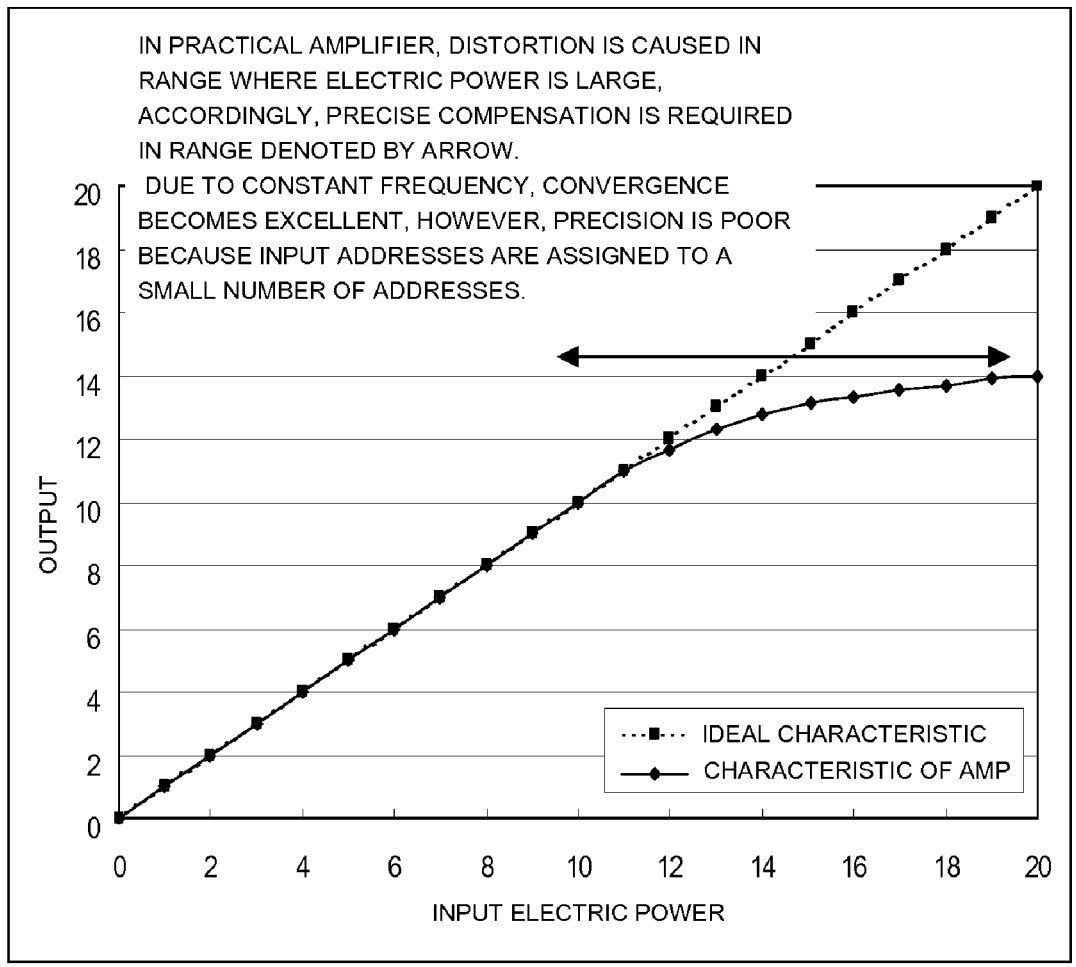
FIG. 4 explains a problem of a conventional technique (fourth)

In FIG. 6, the horizontal axis represents an address input to the distortion compensation table and the vertical axis represents a distortion compensation coefficient value. In FIG. 6, it is found, as compared with FIG. 2, that when the address conversion table is optimized, an abnormal value does not occur as a distortion compensation coefficient.

As above, convergence and distortion compensation performance can be secured simultaneously by optimizing the distribution of the address occurrences in accordance with the present invention. Also, by optimizing an address, the number of addresses can be reduced so that the size of the hardware can be reduced.

FIG. 7 is a block diagram of a control device for the address conversion table.

A specific method of controlling the address conversion table will be explained.

The address generating unit 13 converts electric power supplied to an address value, and transfers the converted value to the address conversion table in the address conversion unit 14. The output from the address conversion table is input to a frequency count address specifying circuit 17-1 in the address frequency operation unit 17. The frequency count address specifying circuit 17-1 specifies a range of addresses in which frequencies of addresses occurrence are to be counted, and allows addresses in the specified range to pass, blocking addresses other than the above specified addresses. An address frequency counter threshold value determination unit 17-2 in the address frequency operation unit 17 counts the number of occurrences of the addresses that passed through the frequency count address specifying circuit 17-1, and compares it with a threshold value. The address frequency counter threshold value determination unit 17-2 transfers the comparison result between the counted range of addresses and the threshold value to a converted address generating unit comprising the CPU 16. The converted address generating unit rewrites the address conversion table for the addresses in the counted range based on the comparison result with the threshold value.

Processes of the control of the address conversion table are specifically explained as below.

(First Step)

The frequency of each address is counted for a prescribed period of time.

When an address with a counted frequency lower than a prescribed value is detected, a slope regarding addresses greater than the detected address of the address conversion table is reduced (the number of input addresses assigned to one output address is increased), and the frequencies of the addresses are increased.

For reducing the slope, a predetermined value (½ for example, to double the number of input addresses assigned to one output address) is adopted.

(Second Step)

In the above, a plurality of threshold values of frequencies of addresses is prepared, and a plurality of slopes is applied to the address conversion table, in accordance with the frequency of an address.

For example, for the range with 0.25 to 0.5 of the address frequency, the threshold value is set to ½, and for the range with 0.25 or lower, the threshold value is set to ¼ (the value ½ doubles the number of input addresses assigned to one output address, and the value ¼ quadruples the number of input addresses assigned to one output address).

For a slope suitable for an address frequency, one of the values which are stored in memory or the like, in advance is adopted.

(Third Step)

As a control of the address conversion table, distortion characteristics are monitored and the address conversion table is controlled so that the distortion compensation characteristic is optimal.

In the above case, a method of controlling the address conversion table is as below.

Figure 8:
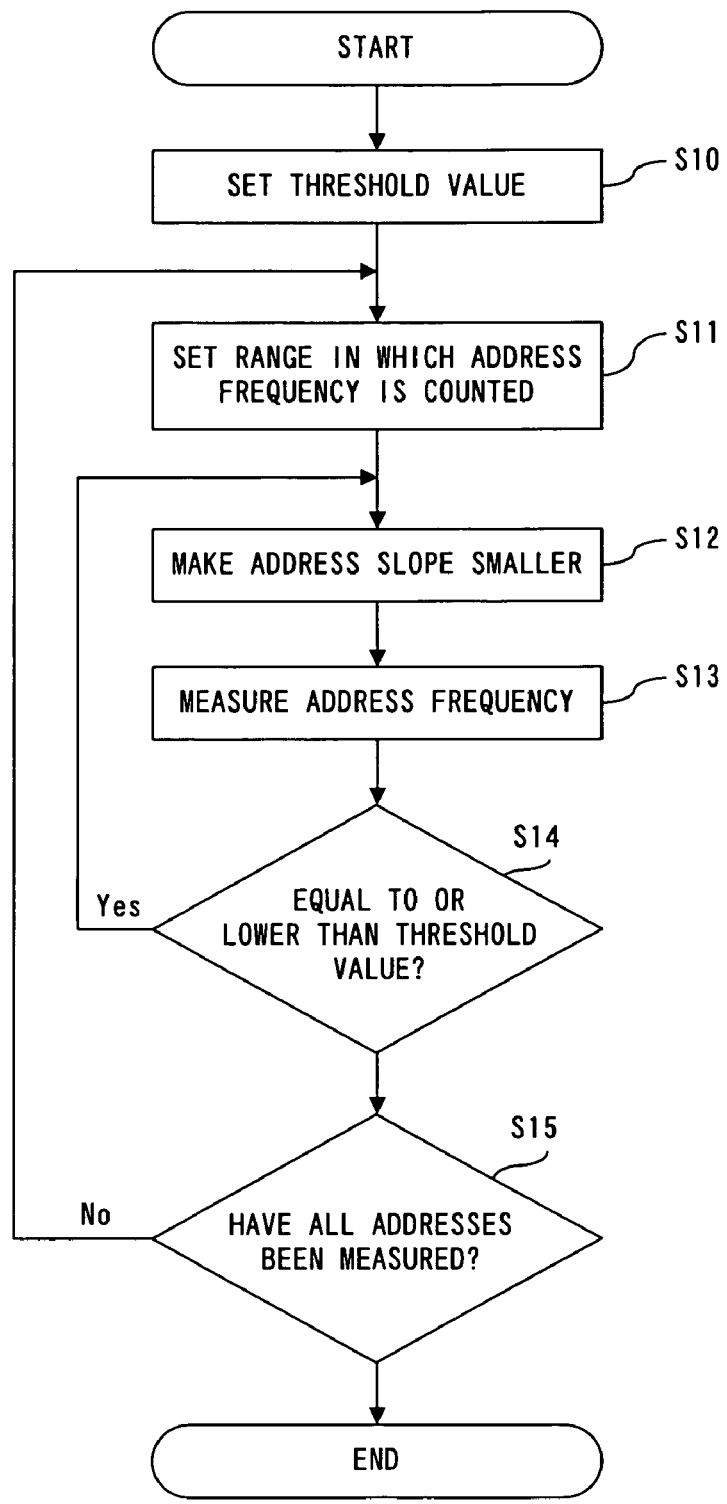
FIG. 8 is a flowchart for explaining processes in an embodiment of the present invention (first)
Figure 9:
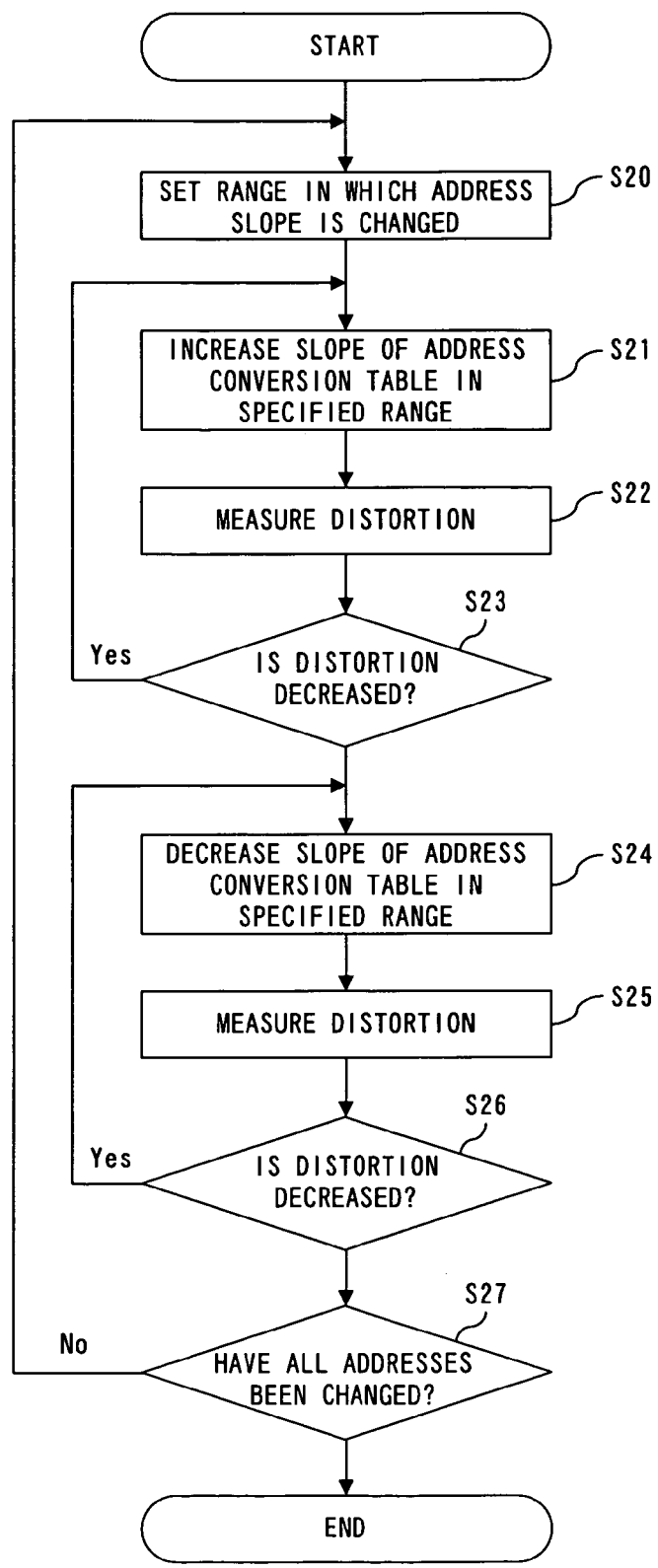
FIG. 9 is a flowchart for explaining processes in an embodiment of the present invention (second).

(1) Conduct an FFT or the like on the output of the amplifier, and measure distortion (2) Increase address frequencies in a particular range (3) Determine whether distortion increased or decreased by measuring the distortion of the amplifier again
(4) Based on the above determination result, further increase the frequency in the case that the distortion has decreased, and inversely, decrease the frequency in the case when the distortion has increased
(5) By repeating (3) and (4), set values in the address conversion table to values by which distortion characteristics are optimized
(6) Repeat processes of (3) to (5) over the particular range which was first specified
(7) Repeat the above processes on all the addresses, and optimize the address conversion table FIG. 8 and FIG. 9 are flowcharts for explaining processes in an embodiment of the present invention.

FIG. 8 is a flowchart for the case where distortion is not measured.

In a step S10, a threshold value is set. In a step S11, a range over which the frequency of occurrence of addresses is counted is set. In a step S12, the slope of addresses in the address conversion table is reduced. Specifically, the number of input addresses assigned to one output address is increased. In a step S13, the frequency of occurrence of addresses in the set range of addresses is measured. In a step S14, it is determined whether or not the frequency of the address is equal to or lower than the threshold value. When it is determined that the frequency of the address is equal to or lower than the threshold value, the process returns to the step S12 and repeats the subsequent processes. When it is determined that the frequency of the address is higher than the threshold value, the process proceeds to a step S15. In the step S15, it is determined whether or not frequencies have been measured for all the addresses. When the determination result in the step S15 is NO, the process returns to the step S11, and a new range of addresses is set and the address conversion table is optimized. When the determination result in the step S15 is YES, the process is terminated. For a method of reducing the address slope, a predetermined value (½, ¼ or the like) is adopted as previously explained.

Additionally, in the above, only a description of reducing the address slope is given, however, it is also possible that another threshold value for the address frequency that is greater than the above threshold value is provided, and in the case when the address frequency is higher than this another threshold value, the address slope is increased (the number of input addresses assigned to one output address is decreased).

FIG. 9 is a flowchart for processes for the case where distortion is measured.

In a step S20, a range in which the address slope is changed is set. In a step S21, the slope of the address conversion table in the specified range is increased. In a step S22, distortion is measured. In a step S23, it is determined whether or not the distortion has decreased. When the determination result of the step S23 is YES, the process returns to the step S21 and repeats the subsequent processes. When the determination result of the step S23 is NO, the process proceeds to a step S24.

In the step S24, the slope of the specified range in the address conversion table is decreased. In a step S25, distortion is measured. In a step S26, it is determined whether or not the distortion has decreased. When the determination result in the step S26 is YES, the process returns to the step S24 and repeats the subsequent processes. When the determination result in the step S26 is NO, the process proceeds to a step S27. In the step S27, it is determined whether or not frequencies have been measured for all the addresses. When the determination result in the step S27 is NO, the process returns to the step S20. When the determination result in the step S27 is YES, the process is terminated.

For the above, the amount of increase or decrease of the slope of the address conversion table can be determined most simply by determining a method of changing it in advance.

In addition it is also possible that the method of optimization of the address conversion table according to an embodiment of the present invention is implemented using a test signal at the final stage of production of a communication device including the distortion compensation device, thereby, an address conversion table can be optimized before shipment, or alternatively an address conversion table can be optimized dynamically while the communication device is used in real-time.

What is claimed is:

1. An address generating device in a distortion compensator which converts an electric power value of an input signal into an address and indexes a table by using an index address for a table made by converting the address, comprising:
   an operation unit for counting a frequency of occurrence of the index address for a table input to the table, and for comparing the counted frequency of occurrence with a threshold value; and
   an address changing unit for changing the number of the addresses corresponding to the index addresses for a table in accordance with the comparison result between the frequency of occurrence and the threshold value.

2. The address generating device according to claim 1, wherein:
   the address changing unit increases the number of the addresses corresponding to the index addresses for a table when the frequency of occurrence is lower than the threshold value.

3. The address generating device according to claim 1, wherein:
   the address changing unit decreases the number of the addresses corresponding to the index addresses for a table when the frequency of occurrence is higher than the threshold value.

4. The address generating device according to claim 1, further comprising:
   a distortion detection unit for measuring an amount of a distortion component included in a signal after the signal is subject to distortion compensation and amplification by an amplifier, wherein:
   the address changing unit adjusts a correspondence between the index address of a table and the address so that the amount of the distortion component decreases.

5. The address generating device according to claim 1, wherein:
   the changing process is conducted for each specified range of index addresses for a table.

6. The address generating device according to claim 1, wherein:
   the changing process changes the number of the addresses corresponding to the index addresses for a table by a prescribed number.

7. The address generating device according to claim 1, wherein:
   the address generating device is activated before shipment of a communication device including the distortion compensator, and the communication device is shipped after completion of the changing process on a table.

8. The address generating device according to claim 1, wherein:

The address generating device dynamically operates while the communication device including the distortion compensator is used.

9. A method of generating an address in a distortion compensator which converts an electric power value of an input signal into an address and indexes a table by using an index address for a table made by converting the address, comprising:

counting a frequency of occurrence of the index address for a table input to the table;

comparing the counted frequency of occurrence with a threshold value; and changing the number of the addresses corresponding to the index addresses for a table in accordance with the comparison result between the frequency of occurrence and the threshold value.

10. The method of claim 9, wherein changing the number of the addresses comprises:

increasing the number of the addresses corresponding to the index addresses for a table when the counted frequency of occurrence is lower than the threshold value.

11. The method of claim 9, wherein changing the number of the addresses comprises:

decreasing the number of the addresses corresponding to the index addresses for a table when the counted frequency of occurrence is higher than the threshold value.

* * * * *